US009516751B2

(12) United States Patent
Hayashi et al.

(10) Patent No.: US 9,516,751 B2
(45) Date of Patent: Dec. 6, 2016

(54) WIRING BOARD AND METHOD FOR MANUFACTURING SAME

(71) Applicant: NGK SPARK PLUG CO., LTD., Nagoya-shi, Aichi (JP)

(72) Inventors: Takahiro Hayashi, Komaki (JP); Makoto Nagai, Komaki (JP); Seiji Mori, Kounan (JP); Tomohiro Nishida, Mizuho (JP); Makoto Wakazono, Niwa-gun (JP); Tatsuya Ito, Kakamigahara (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 14/417,751

(22) PCT Filed: May 17, 2013

(86) PCT No.: PCT/JP2013/003137
§ 371 (c)(1),
(2) Date: Jan. 27, 2015

(87) PCT Pub. No.: WO2014/045491
PCT Pub. Date: Mar. 27, 2014

(65) Prior Publication Data
US 2015/0208501 A1 Jul. 23, 2015

(30) Foreign Application Priority Data
Sep. 21, 2012 (JP) ................. 2012-208987

(51) Int. Cl.
*H05K 1/11* (2006.01)
*G03F 7/20* (2006.01)
(Continued)

(52) U.S. Cl.
CPC .............. *H05K 1/111* (2013.01); *G03F 7/038* (2013.01); *G03F 7/20* (2013.01); *G03F 7/2024* (2013.01);
(Continued)

(58) Field of Classification Search
CPC .......................................... H05K 2201/10287
USPC ........................................................ 174/251
See application file for complete search history.

(56) References Cited

U.S. PATENT DOCUMENTS 7,268,437 B2 9/2007 Liu
8,166,648 B2 5/2012 Fukase
(Continued)

FOREIGN PATENT DOCUMENTS

JP 48-112955 A 12/1973
JP S49-069057 7/1974
(Continued)

OTHER PUBLICATIONS

JPO, Notification of Reason for Rejection issued in corresponding Japanese Application No. 2012-208987, dispatched Nov. 5, 2013.
(Continued)

*Primary Examiner* — Hoa C Nguyen
*Assistant Examiner* — Stanley Tso
(74) *Attorney, Agent, or Firm* — Stites & Harbison, PLLC; Jeffrey A. Haeberlin; James R. Hayne

(57) ABSTRACT

To provide a wiring board excellent in connection reliability with a semiconductor chip. A first buildup layer 31 where resin insulating layers 21 and 22 and a conductor layer 24 are laminated is formed at a substrate main surface 11 side of an organic wiring board 10. The conductor layer 24 for an outermost layer in the first buildup layer 31 includes a plurality of connecting terminal portions 41 for flip-chip mounting a semiconductor chip. The plurality of connecting terminal portions 41 is exposed through an opening portion 43 of a solder resist layer 25. Each connecting terminal portion 41 includes a connection region 51 for a semiconductor chip and a wiring region 52 disposed to extend from the connection region 51 along the planar direction. The solder resist layer 25 includes, within the opening portion 43, a side-surface covering portion 55 that covers the side surface of the connecting terminal portion 41 and a projecting wall portion 56 that is integrally formed with the side-surface covering portion 55 and disposed to project so as to intersect with the connection region 51.

4 Claims, 6 Drawing Sheets

(51) Int. Cl.
*G03F 7/30* (2006.01)
*H05K 1/02* (2006.01)
*G03F 7/038* (2006.01)
*H01L 23/498* (2006.01)
*H05K 3/34* (2006.01)
*H05K 3/46* (2006.01)

(52) U.S. Cl.
CPC ............... *G03F 7/30* (2013.01); *H05K 1/0298* (2013.01); *H05K 3/3452* (2013.01); *H01L 23/49822* (2013.01); *H01L 2224/16237* (2013.01); *H05K 3/3436* (2013.01); *H05K 3/4644* (2013.01); *H05K 2201/099* (2013.01); *H05K 2201/09409* (2013.01); *H05K 2201/09427* (2013.01); *H05K 2201/09709* (2013.01); *H05K 2201/09845* (2013.01); *H05K 2201/10674* (2013.01); *H05K 2203/058* (2013.01); *H05K 2203/0594* (2013.01); *H05K 2203/1476* (2013.01)

(56) References Cited

U.S. PATENT DOCUMENTS

| | | |
|---|---|---|
| 2003/0011999 A1 | 1/2003 | Urakawa et al. |
| 2005/0253231 A1 | 11/2005 | Liu |
| 2008/0135279 A1 | 6/2008 | Ishido |
| 2009/0218122 A1 | 9/2009 | Fukase |
| 2010/0208437 A1* | 8/2010 | Maeda ................ H01L 21/4857 361/760 |
| 2013/0256910 A1* | 10/2013 | Lee .................. H01L 21/76802 257/774 |

FOREIGN PATENT DOCUMENTS

| | | | |
|---|---|---|---|
| JP | 53-004468 | * 7/1976 | ........... H01L 21/283 |
| JP | 52-039373 A | 3/1977 | |
| JP | 53-4468 A | 1/1978 | |
| JP | S62-152443 U | 9/1987 | |
| JP | 07-321151 A | 12/1995 | |
| JP | 11-340277 A | 12/1999 | |
| JP | 2001-156203 A | 6/2001 | |
| JP | 2001-320168 A | 11/2001 | |
| JP | 2008-147458 A | 6/2008 | |
| JP | 2009-212228 A | 9/2009 | |
| TW | 200537669 A | 11/2005 | |

OTHER PUBLICATIONS

JPO, Decision of Rejection issued in corresponding Japanese Application No. 2012-208987, dispatched Apr. 1, 2014.
JPO/ISA, International Search Report in corresponding international application No. PCT/JP2013/003137, mailed Aug. 20, 2013.
Taiwan Intellectual Property Office, Notification for the Opinion of Examination issued in corresponding Application No. 102120846, mailed Jul. 27, 2016.

* cited by examiner

WIRING BOARD AND METHOD FOR MANUFACTURING SAME

TECHNICAL FIELD

The present invention relates to a wiring board that includes a plurality of connecting terminal portions for flip-chip mounting a semiconductor chip, and to a method for manufacturing the wiring board.

BACKGROUND ART

Nowadays, a semiconductor integrated circuit element (semiconductor chip) to be used as, for example, a microprocessor for a computer is increasingly getting high-speed and sophisticated. Concomitantly, there is a trend that the number of terminals increases and pitch between terminals narrows. Typically, multiple connecting terminals are arranged on a bottom surface of the semiconductor chip. Respective connecting terminals of the semiconductor chip connect to a plurality of connecting terminal portions formed on a wiring board in a flip-chip structure.

For more details, the connecting terminal portion of the wiring board includes a conductor layer mainly constituted of copper, and connects to the connecting terminal at the semiconductor chip side via, for example, a solder bump. In this wiring board, in the case where the distance between adjacent connecting terminal portions narrows, there is concern that the solder flows out to the adjacent terminal portion and wiring during connection of the semiconductor chip, and then a problem such as a short circuit between terminals occurs. In order to avoid this problem, a wiring board that has a resist pattern for separating the wiring and the terminal portion has been proposed (for example, see Patent Document 1). The wiring board in Patent Document 1 includes a first solder resist layer and a second solder resist layer. The first solder resist layer includes a first opening portion in which a part of solder bump is buried. The second solder resist layer includes a second opening portion that is disposed on this solder resist layer and penetrated by the solder bump. In the wiring board, the second solder resist layer is formed in a grid pattern to surround the respective solder bumps on the staggered connecting terminal portions. Disposing the second solder resist layer prevents the solder from flowing out during connection of the semiconductor chip. In other words, the second solder resist layer also functions as a solder flow-out preventing dam.

CITATION LIST

Patent Literatures

Patent Document 1: JP-A-2008-147458

DISCLOSURE OF THE INVENTION

Problems to be Solved by the Invention

However, in the wiring board disclosed in Patent Document 1, in the case of narrowing the pitch between the connecting terminal portions so as to increase the density, it is necessary to scale down the pattern of the second solder resist layer. Additionally, the first solder resist layer and the second solder resist layer are separately formed. In association with the scaling down of the resist pattern, the connection area of the second solder resist layer decreases. This causes insufficient interfacial strength between the first solder resist layer and the second solder resist layer. There is concern about a problem that the pattern of the second solder resist layer is delaminated.

The present invention has been made in view of the above-described problems, and it is an object of the present invention to provide a wiring board excellent in connection reliability with a semiconductor chip. Another object is to provide a method for manufacturing a wiring board to manufacture a wiring board excellent in connection reliability with a semiconductor chip.

Solutions to the Problems

A means for solving the above problems (Means 1) is a wiring board includes a laminated body where respective one or more layers of insulating layers and conductor layers are laminated. The conductor layer in an outermost layer of the laminated body includes a connecting terminal portion disposed in a mounting area for a semiconductor chip so as to flip-chip mount the semiconductor chip. A solder resist layer is disposed as the insulating layer in an outermost layer of the laminated body. The connecting terminal portion includes a surface exposed through an opening portion formed in the solder resist layer. The connecting terminal portion includes a connection region and a wiring region. The connection region is to connect to a connecting terminal of the semiconductor chip via solder. The wiring region is disposed to extend from the connection region along a planar direction. The solder resist layer includes a side-surface covering portion and a projecting wall portion. The side-surface covering portion covers a side surface of the connecting terminal portion. The projecting wall portion is integrally formed with the side-surface covering portion. The projecting wall portion is disposed to project so as to intersect with the connection region in the connecting terminal portion.

With the invention described in Means 1, in the solder resist layer, the projecting wall portion is integrally formed with the side-surface covering portion that covers the side surface of the connecting terminal portion. This projecting wall portion is disposed to project so as to intersect with the connection region in the connecting terminal portion. Here, in case of increasing the density of the wiring board, it becomes necessary to narrow the width of the projecting wall portion in the solder resist layer as the density becomes higher. Also in this case, the projecting wall portion is integrally formed with the side-surface covering portion. This ensures sufficient strength. Accordingly, this avoids the problem that the projecting wall portion is delaminated. Additionally, when the semiconductor chip is mounted, the projecting wall portion functions as a solder dam. This prevents the solder in the connection region from flowing out to the wiring region, thus reliably holding the solder in the connection region. This enhances connection reliability with the semiconductor chip in the wiring board.

In the connecting terminal portion of the wiring board, the wiring regions may be disposed to extend from both sides of the connection region in the planar direction. Alternatively, the wiring region may be disposed to extend from only one side of the connection region in the planar direction.

A plurality of the connecting terminal portions may be arrayed along an outer periphery of the mounting area for the semiconductor chip, and the plurality of the connecting terminal portions may be exposed through the opening portion of the solder resist layer. The projecting wall portion may be disposed to extend so as to intersect with a plurality of the wiring regions. Forming the projecting wall portion in this manner also ensures sufficient strength. Thus, the projecting wall portion can function as a solder dam. Accordingly, disposing the projecting wall portion allows reliably holding the solder in each connection region and enhances connection reliability with the semiconductor chip in the wiring board.

The projecting wall portion may be integrally formed with an inner wall surface of the solder resist layer. The inner wall surface forms the opening portion. This increases the strength of the projecting wall portion, thus reliably avoiding the problem that the projecting wall portion is delaminated.

The projecting wall portion may have a width of 5 μm or more and 50 μm or less. Also in case of thinning down the projecting wall portion in the solder resist layer in this manner, the projecting wall portion is integrally formed with the side-surface covering portion. This ensures sufficient strength.

In case of increasing the density of the wiring board, the terminal pitch between the plurality of connecting terminal portions formed on this wiring board may be 80 μm or less. In case of further increasing the density, the terminal pitch may be 40 μm or less. In case of increasing the density of the wiring board by narrowing the terminal pitch in this manner, the area of the connection region decreases. This reduces the usage of the solder. In this case, forming the projecting wall portion in the same manner as the present invention reliably holds the solder in the connection region, thus ensuring sufficient connection reliability with the semiconductor chip.

Furthermore, in the wiring board, a plurality of the connecting terminal portions may be arrayed such that respective extending directions of the wiring regions are parallel to one another. In this case, in connecting terminal portions adjacent along an arranging direction, the connection regions may be disposed in mutually shifted positions in a direction perpendicular to the arranging direction (the extending direction of the wiring region) such that positions of the connection regions do not overlap one another along the arranging direction. This allows narrowing the terminal pitch between the plurality of connecting terminal portions, thus increasing the density of the wiring board.

The wiring board in Means 1 can employ a ceramic wiring board using a ceramic insulating layer as the insulating layer and an organic wiring board using a resin insulating layer as the insulating layer. Especially, use of the organic wiring board as the wiring board increases the density of the wiring. Thus, this form is preferred to adopt the constitution of the present invention.

The resin insulating layer may be formed using a buildup material mainly formed of thermosetting resin. Specific examples of the formation material of the resin insulating layer include thermosetting resin such as epoxy resin, phenolic resin, urethane resin, silicone resin, polyimide resin. Additionally, a composite material of any of these resins and glass fibers (glass woven fabric and glass nonwoven fabric) and/or organic fibers such as polyamide fibers may be used. Alternatively, for example, a resin-resin composite material where thermosetting resin such as epoxy resin is impregnated into a three-dimensional mesh fluorine-based resin base material such as a continuous porous PTFE may be used.

The conductor layer in the organic wiring board is constituted mainly of copper. In this case, the conductor layer is formed by a publicly-known method such as a subtractive method, a semi-additive method, and a full-additive method. Specifically, for example, a method of etching of copper foil, electroless copper plating, or electrolytic copper plating is applied. The conductor layer can be formed by forming a thin film using a method of, for example, spatter deposition or CVD and then etching the film. Alternatively, the conductor layer can be formed by, for example, printing conductive paste.

The semiconductor chip may employ an IC chip such as an IC chip used as a microprocessor for a computer, a dynamic random access memory (DRAM), and a static random access memory (SRAM).

Another means for solving the above problems (Means 2) is a method for manufacturing a wiring board. The wiring board includes a laminated body where respective one or more layers of insulating layers and conductor layers are laminated. The conductor layer in an outermost layer of the laminated body includes a connecting terminal portion disposed in a mounting area for a semiconductor chip so as to flip-chip mount the semiconductor chip. A solder resist layer is disposed as the insulating layer in an outermost layer of the laminated body. The connecting terminal portion includes a surface exposed through an opening portion formed in the solder resist layer. The method includes a conductor-layer forming step and a solder resist layer-forming step. The conductor-layer forming step forms the conductor layer in the outermost layer of the laminated body. The conductor-layer forming step forms the connecting terminal portion that includes a connection region and a wiring region. The connection region is to connect to a connecting terminal of the semiconductor chip via solder. The wiring region is disposed to extend from the connection region along a planar direction. The solder resist layer-forming step arranges a resin insulating material with photosensitivity to be the solder resist layer so as to cover a side surface and a top surface of the connecting terminal portion, repeats partial exposure and development on the resin insulating material a plurality of times in stages so as to form the opening portion, and forms the solder resist layer that includes a side-surface covering portion and a projecting wall portion. The side-surface covering portion covers the side surface of the connecting terminal portion within the opening portion. The projecting wall portion is integrally formed with the side-surface covering portion. The projecting wall portion is disposed to project so as to intersect with the connection region in the connecting terminal portion.

With the invention described in Means 2, in the solder resist layer, the side-surface covering portion that covers the side surface of the connecting terminal portion is formed within the opening portion. Additionally, the projecting wall portion is integrally formed with the side-surface covering portion. The projecting wall portion is disposed to project so as to intersect with the connection region in the connecting terminal portion. Forming the solder resist layer in this manner ensures sufficient strength of the projecting wall portion, thus avoiding the problem that the resist pattern of the projecting wall portion is delaminated. When the connecting terminal of the semiconductor chip connects to the connection region with solder, the projecting wall portion functions as a solder dam. This avoids the problem that the solder of the connection region flows out to the wiring region. This enhances connection reliability with the semiconductor chip in the wiring board.

The resin insulating material to be the solder resist layer is an insulator film. The solder resist layer-forming step may arrange the insulator film on the connecting terminal portion, press the insulator film in the thickness direction of the film in order to ensure flatness of the surface, and then perform exposure and development. This ensures flatness of the surfaces of the projecting wall portion and the side-surface covering portion, thus improving connection reliability of the wiring board.

DESCRIPTION OF PREFERRED EMBODIMENTS

Figure 1:
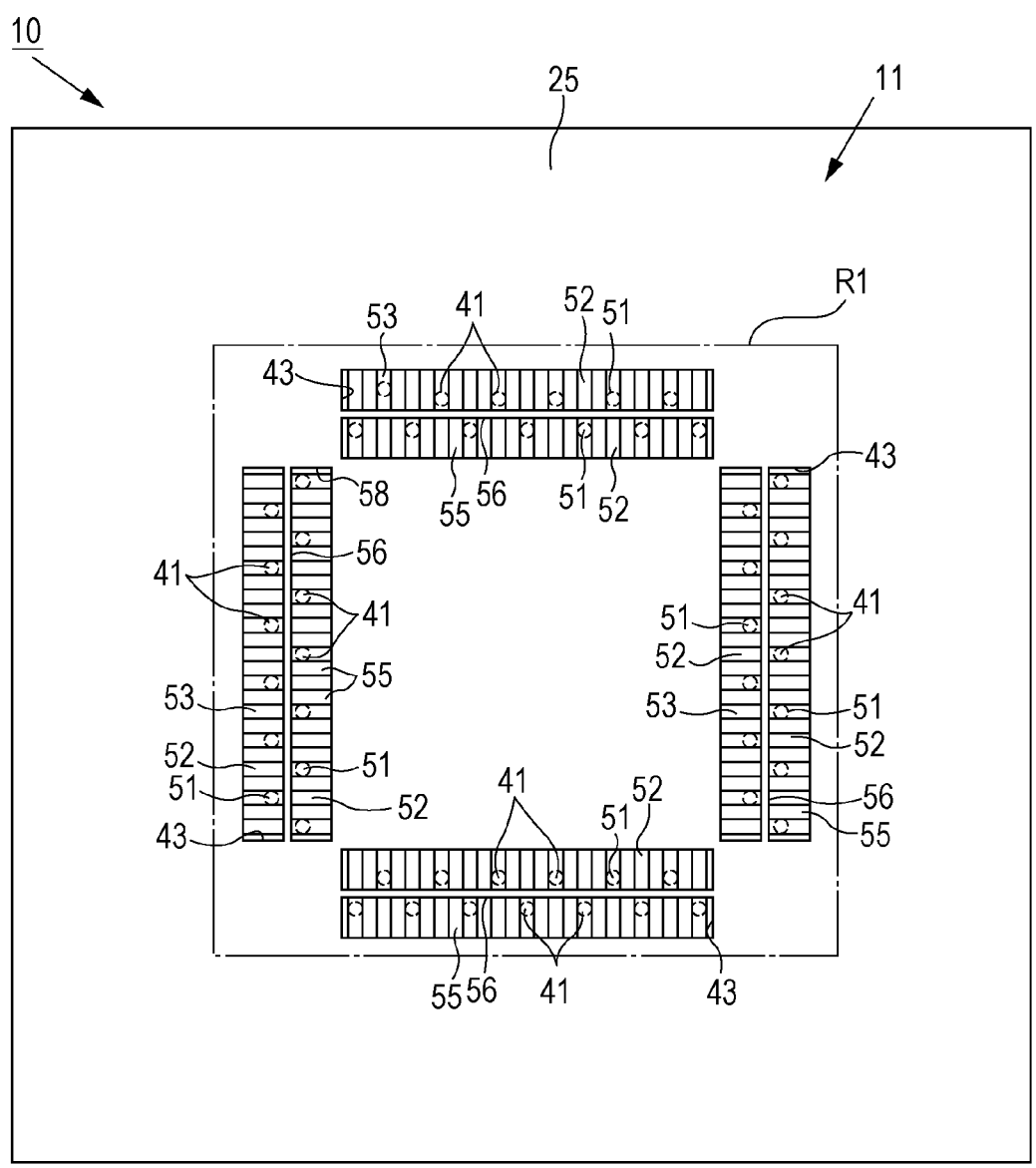
FIG. 1 is a top view illustrating an organic wiring board according to one embodiment.
Figure 2:
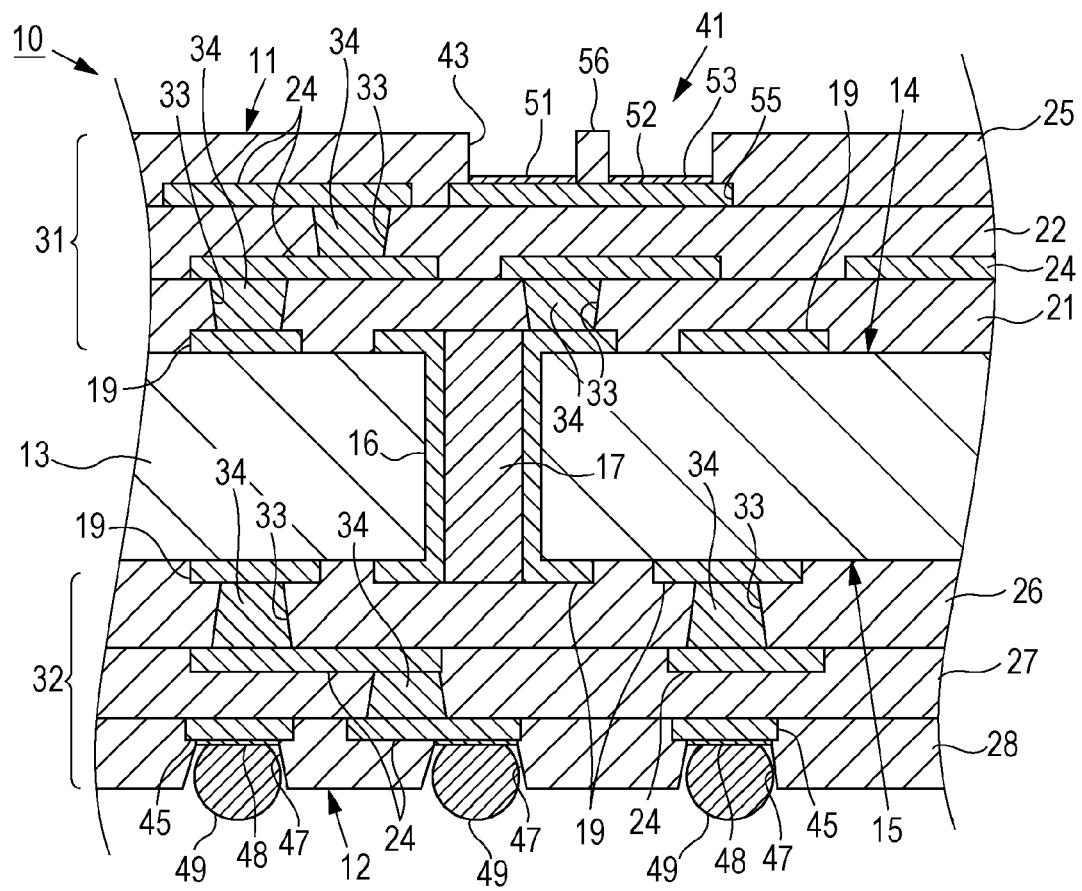
FIG. 2 is an enlarged sectional view illustrating the main part of the organic wiring board according to the one embodiment.

Hereinafter, a description will be given of one embodiment where the present invention is embodied in an organic wiring board as a wiring board in detail based on the drawings. FIG. 1 is a top view of the organic wiring board according to this embodiment. FIG. 2 is an enlarged sectional view illustrating the main part of the organic wiring board.

As illustrated in FIG. 1 and FIG. 2, an organic wiring board 10 according to this embodiment includes a substrate main surface 11 to be a semiconductor chip-mounting surface and a substrate reverse surface 12 on the opposite side of the substrate main surface 11. For details, the organic wiring board 10 includes a core substrate 13 in a rectangular plate shape, a first buildup layer 31, and a second buildup layer 32. The first buildup layer 31 is formed on a core main surface 14 (the top surface in FIG. 2) of the core substrate 13. The second buildup layer 32 is formed on a core reverse surface 15 (the inferior surface in FIG. 2) of the core substrate 13.

The core substrate 13 according to this embodiment is constituted of, for example, resin insulating material (glass epoxy material) where epoxy resin is impregnated into a glass cloth as reinforcement material. In the core substrate 13, a plurality of through-hole conductors 16 are formed penetrating the core main surface 14 and the core reverse surface 15. The interior of the through-hole conductor 16 is filled with, for example, a blocking body 17 such as epoxy resin. On the core main surface 14 and the core reverse surface 15 of the core substrate 13, conductor layers 19 made of copper are patterned. Each conductor layer 19 electrically connects to the through-hole conductor 16.

The first buildup layer 31 formed on the core main surface 14 of the core substrate 13 is a laminated body with a structure where a plurality of resin insulating layers 21 and 22 (insulating layers) made of thermosetting resin (epoxy resin) and a plurality of conductor layers 24 made of copper are laminated. In the first buildup layer 31, a conductor layer 24 as the outermost layer includes a plurality of connecting terminal portions 41 arranged along the outer periphery of a mounting area R1 for the semiconductor chip, for flip-chip mounting the semiconductor chip (not illustrated). In the first buildup layer 31, a solder resist layer 25 is disposed as an insulating layer for the outermost layer. In the solder resist layer 25, a plurality of slit-like opening portions 43 is formed in positions corresponding to four sides of the mounting area R1 for the semiconductor chip. Within the opening portions 43 of the solder resist layer 25, the plurality of connecting terminal portions 41 are formed.

In this embodiment, the plurality of connecting terminal portions 41 is disposed on the top surface of the resin insulating layer 22. In the resin insulating layers 21 and 22, respective via holes 33 and filled via conductors 34 are formed. Each via conductor 34 electrically connects to respective conductor layers 19 and 24 and the connecting terminal portion 41.

The semiconductor chip to be mounted on the wiring board 10 according to this embodiment employs a semiconductor chip with a connecting terminal in, for example, a Cu pillar structure. Other than the Cu pillar structure, a semiconductor chip with a connecting terminal in an Au-plated bump structure or an Au stud structure may be flip-chip mounted.

The second buildup layer 32 formed on the core reverse surface 15 of the core substrate 13 has approximately the same structure as that of the above-described first buildup layer 31. That is, the second buildup layer 32 has a structure where resin insulating layers 26 and 27 and the conductor layers 24 are laminated. In the second buildup layer 32, a plurality of external connecting terminals 45 are formed to connect to a motherboard (not illustrated) as the conductor layer 24 for the outermost layer. Also in the resin insulating layers 26 and 27, the via holes 33 and the via conductors 34 are formed. Each via conductor 34 electrically connects to the conductor layers 19 and 24 and the external connecting terminal 45. Furthermore, a solder resist layer 28 is disposed in the outermost layer of the second buildup layer 32. In predetermined positions of the solder resist layer 28, opening portions 47 are disposed for exposing the external connecting terminals 45. In the external connecting terminal 45, the inferior surface exposed within the opening portion 47 is covered with a plating layer 48 (such as a tin plating layer). On this inferior surface of the external connecting terminal 45, a plurality of solder bumps 49 electrically connectable to the motherboard (not shown) is disposed. With the respective solder bumps 49, the organic wiring board 10 is mounted on the motherboard (not shown).

Next, a detailed description will be given of a concrete constitution of the connecting terminal portion 41 formed in the first buildup layer 31 on the substrate main surface 11 side.

Figure 3:
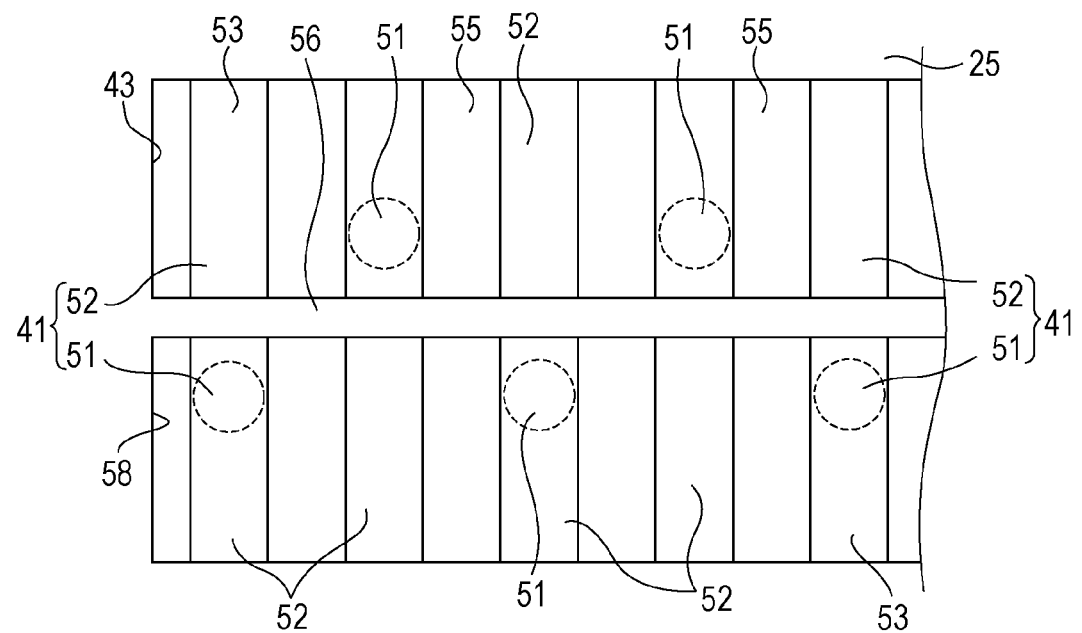
FIG. 3 is an enlarged top view illustrating respective connecting terminal portions, side-surface covering portions, and projecting wall portions within an opening portion.

As illustrated in FIG. 2 and FIG. 3, each connecting terminal portion 41 includes a connection region 51 (the region illustrated as a dotted-line circle in FIG. 3) and a wiring region 52. The connection region 51 is to connect to the connecting terminal of the semiconductor chip via solder. The wiring region 52 is disposed to extend from both sides (the upper side and the lower side in FIG. 3) of the connection region 51 along a planar direction. Each connecting terminal portion 41 (the connection region 51 and the wiring region 52) is constituted mainly of copper and has a surface on which a plating layer 53 (such as a tin plating layer) is formed. Here, this plating layer 53 of the connecting terminal portion 41 and the above-described plating layer 48 of the external connecting terminal 45 may be a plating layer that includes at least any one layer of a nickel plating layer, a palladium plating layer, and a gold plating layer other than the tin plating layer. Instead of the plating layers 53 and 48, an organic solderability preservative (OSP) process for rust prevention may be performed on the surfaces of the connecting terminal portion 41 and the external connecting terminal 45. Alternatively, a solder coating process may be performed.

In the plurality of connecting terminal portions 41 arrayed within the opening portion 43 of the solder resist layer 25, the respective wiring regions 52 are disposed to have extending directions parallel to one another. The respective connection regions 51 are arranged in mutually shifted positions in a staggered arrangement. That is, in the adjacent connecting terminal portions 41 along the arranging direction, the respective connection regions 51 are arranged in mutually shifted positions in a direction perpendicular to the arranging direction (the extending direction of the wiring region 52) such that the positions of the connection region 51 do not overlap one another along the arranging direction. Thus, formation of the connecting terminal portion 41 allows narrowing the terminal pitch between the respective connecting terminal portions 41. Here, the terminal pitch according to this embodiment is for example, 40 μm.

Figure 4:
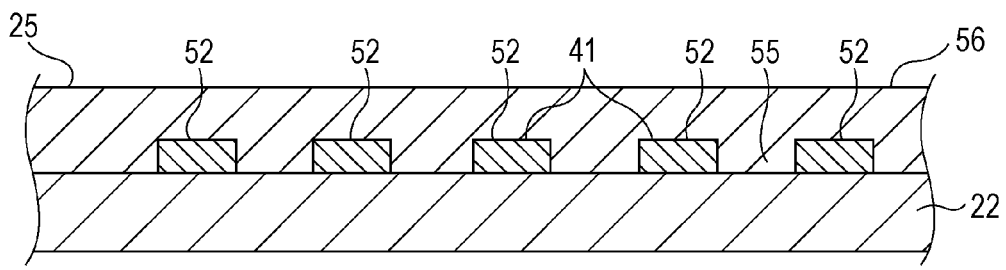
FIG. 4 is an enlarged sectional view illustrating the respective connecting terminal portions and projecting wall portions.
Figure 5:
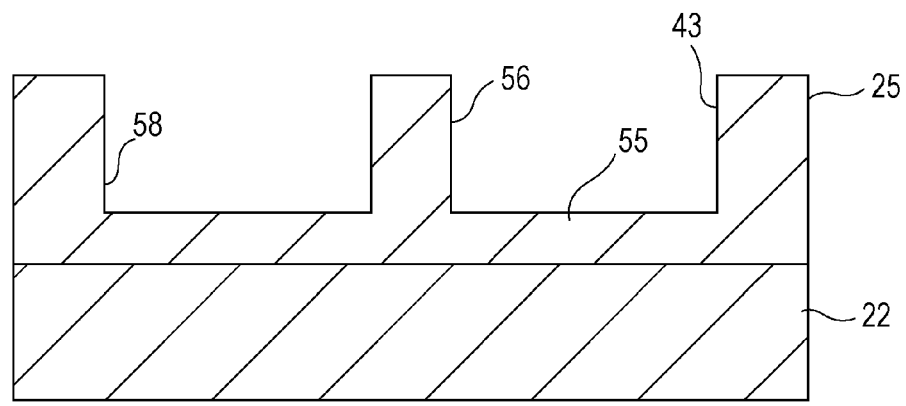
FIG. 5 is an enlarged sectional view illustrating the side-surface covering portion and the projecting wall portion.

The solder resist layer 25 includes a side-surface covering portion 55 and a projecting wall portion 56 within the opening portion 43. The side-surface covering portion 55 covers the side surface of the connecting terminal portion 41. The projecting wall portion 56 is disposed to project so as to intersect with the connection region 51 in the connecting terminal portion 41. The projecting wall portion 56 is disposed in a straight line along the longer side direction of the opening portion 43 to divide the central portion in the shorter side direction of the opening portion 43. In this embodiment, in the solder resist layer 25, the projecting wall portion 56 is integrally formed with the side-surface covering portion 55 (see FIG. 4 and FIG. 5). Furthermore, the projecting wall portion 56 is integrally formed with an inner wall surface 58 (see FIG. 3), which forms the opening portion 43, in the solder resist layer 25. FIG. 4 is a sectional view of the projecting wall portion 56 illustrated in FIG. 3, taken along the longer side direction of the projecting wall portion 56. FIG. 5 is a sectional view of the projecting wall portion 56 taken along a direction perpendicular to the longer side direction (the shorter side direction) of the projecting wall portion 56. As illustrated in FIG. 3 and FIG. 4, the projecting wall portion 56 has a width of approximately 15 and is disposed to extend so as to perpendicularly intersect with the plurality of wiring regions 52. This projecting wall portion 56 functions as a solder dam to prevent the solder from flowing out from the connection region 51 to the wiring region 52 in each connecting terminal portion 41. In this embodiment, in the solder resist layer 25, the projecting wall portion 56 is formed to have the same height as the height of the peripheral portion of the opening portion 43 that exposes the connecting terminal portion 41 (see FIG. 5).

Next, a description will be given of a method for manufacturing the organic wiring board 10 according to this embodiment.

Figure 6:
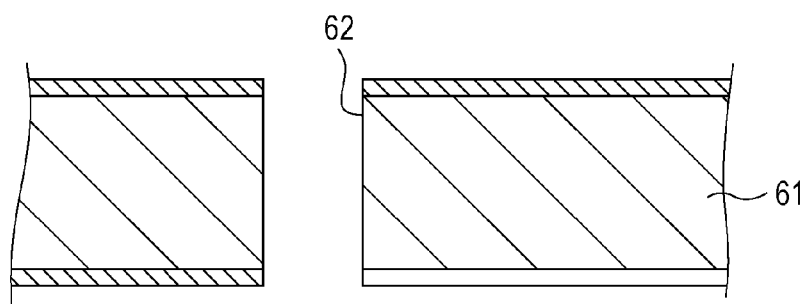
FIG. 6 is an explanatory view illustrating a method for manufacturing the organic wiring board according to the one embodiment.

First, a copper-clad laminate where copper foils are pasted on both surfaces of a base material made of glass epoxy is prepared. Subsequently, a drilling machine is used to perform drilling processing such that a penetration hole 62 (see FIG. 6) penetrating the front and reverse surfaces of a copper-clad laminate 61 is preliminarily formed in a predetermined position. Subsequently, electroless copper plating and electrolytic copper plating are performed on the inner surface of the penetration hole 62 of the copper-clad laminate 61, so as to form the through-hole conductor 16 inside of the penetration hole 62.

Figure 7:
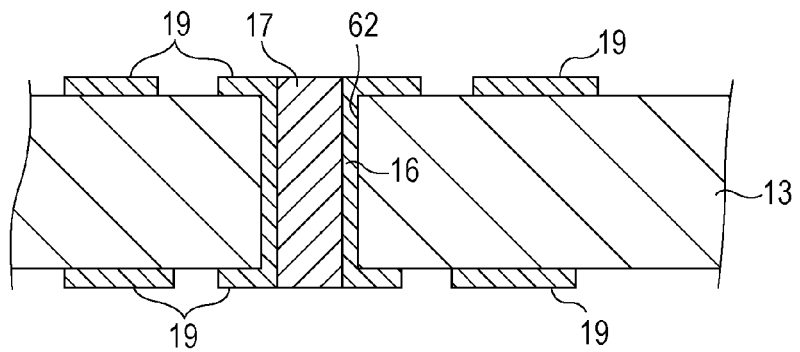
FIG. 7 is an explanatory view illustrating the method for manufacturing the organic wiring board according to the one embodiment.

Subsequently, the void portion of the through-hole conductor 16 is plugged with insulating resin material (epoxy resin), so as to form the blocking body 17. Furthermore, the copper foils of the copper-clad laminate 61 and copper plating layers formed on the copper foils are patterned by, for example, a subtractive method. As a result, as illustrated in FIG. 7, the core substrate 13 where the conductor layer 19 and the through-hole conductor 16 are formed is obtained.

Subsequently, a buildup step is performed so as to form the first buildup layer 31 on the core main surface 14 of the core substrate 13 and also to form the second buildup layer 32 on the core reverse surface 15 of the core substrate 13.

Figure 8:
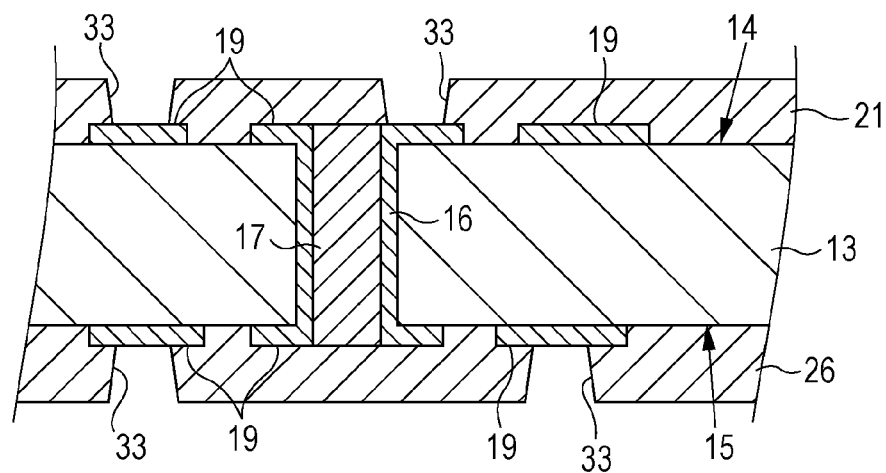
FIG. 8 is an explanatory view illustrating the method for manufacturing the organic wiring board according to the one embodiment.

For details, on the core main surface 14 and the core reverse surface 15 of the core substrate 13, the sheet-shaped resin insulating layers 21 and 26 made of epoxy resin are arranged to paste the resin insulating layers 21 and 26. Subsequently, for example, an excimer laser, a UV laser, or a $CO_2$ laser is used to perform laser processing so as to form via holes 33 at predetermined positions in the resin insulating layers 21 and 26 (see FIG. 8). Subsequently, an etching solution such as a potassium permanganate solution is used to perform a desmear step for removing smear inside of each via hole 33. As the desmear step, for example, plasma ashing treatment using $O_2$ plasma may be performed other than the treatment using etching solution.

Figure 9:
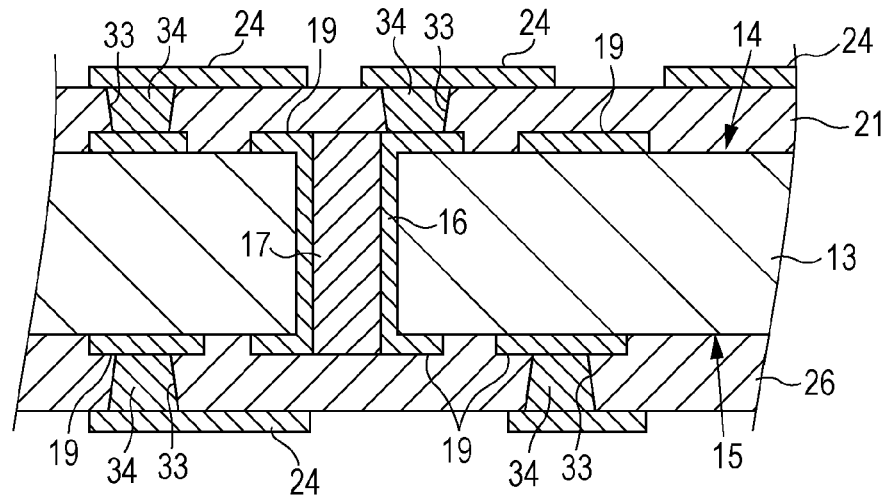
FIG. 9 is an explanatory view illustrating the method for manufacturing the organic wiring board according to the one embodiment.

After the desmear step, in accordance with a conventionally-known method, electroless copper plating and electrolytic copper plating are performed so as to form the via conductor 34 inside of each via hole 33. Furthermore, etching is performed with a conventionally-known method (such as a semi-additive method) to form patterns of the conductor layers 24 on the resin insulating layers 21 and 26 (see FIG. 9).

Figure 10:
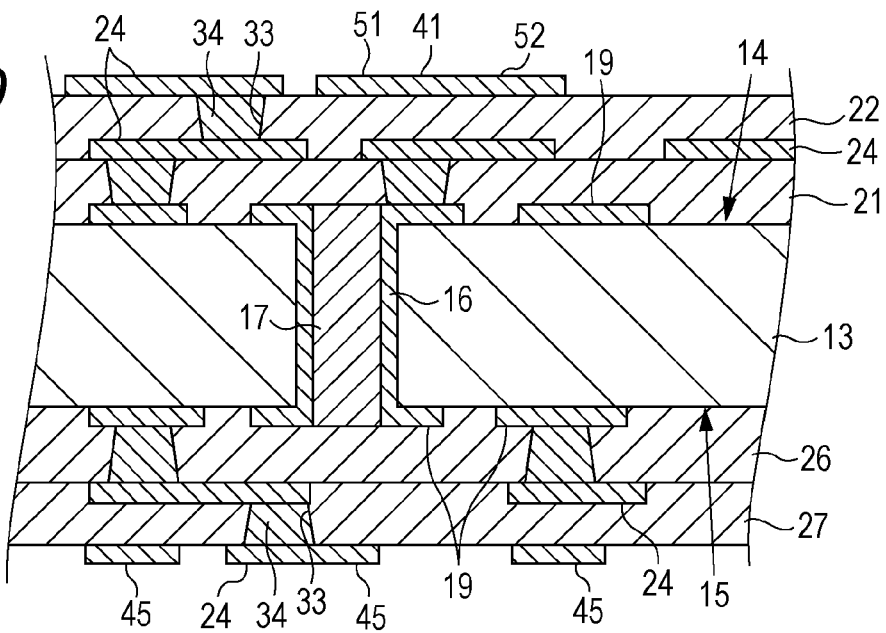
FIG. 10 is an explanatory view illustrating the method for manufacturing the organic wiring board according to the one embodiment.

The other resin insulating layers 22 and 27 and the conductor layers 24 are also formed by methods similar to those of the resin insulating layers 21 and 26 and the conductor layers 24 described above, and are laminated on the resin insulating layers 21 and 26. Here, as the conductor layers 24 on the resin insulating layers 22, the plurality of connecting terminal portions 41 that each include the connection region 51 and the wiring region 52 are formed (a conductor-layer forming step). As the conductor layers 24 on the resin insulating layers 27, the plurality of external connecting terminals 45 are formed (see FIG. 10).

Figure 11:
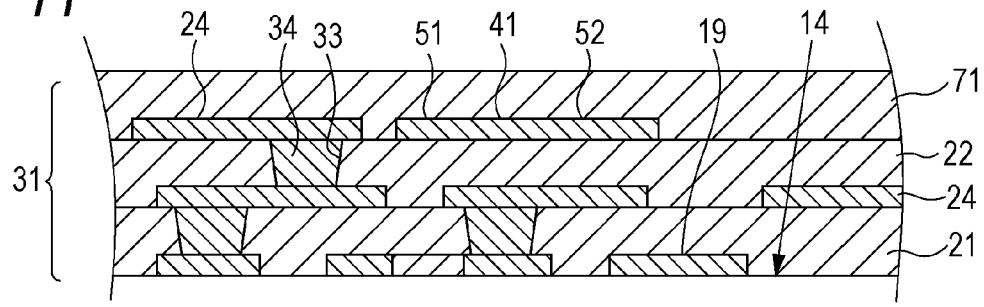
FIG. 11 is an explanatory view illustrating the method for manufacturing the organic wiring board according to the one embodiment.
Figure 12:
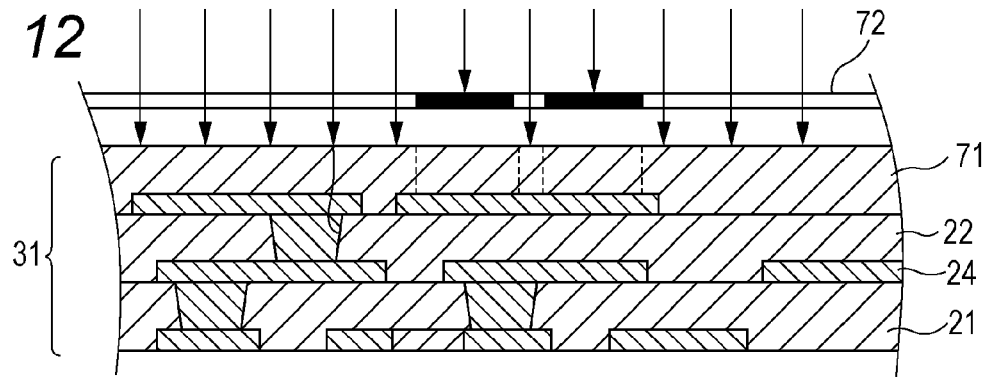
FIG. 12 is an explanatory view illustrating the method for manufacturing the organic wiring board according to the one embodiment.
Figure 13:
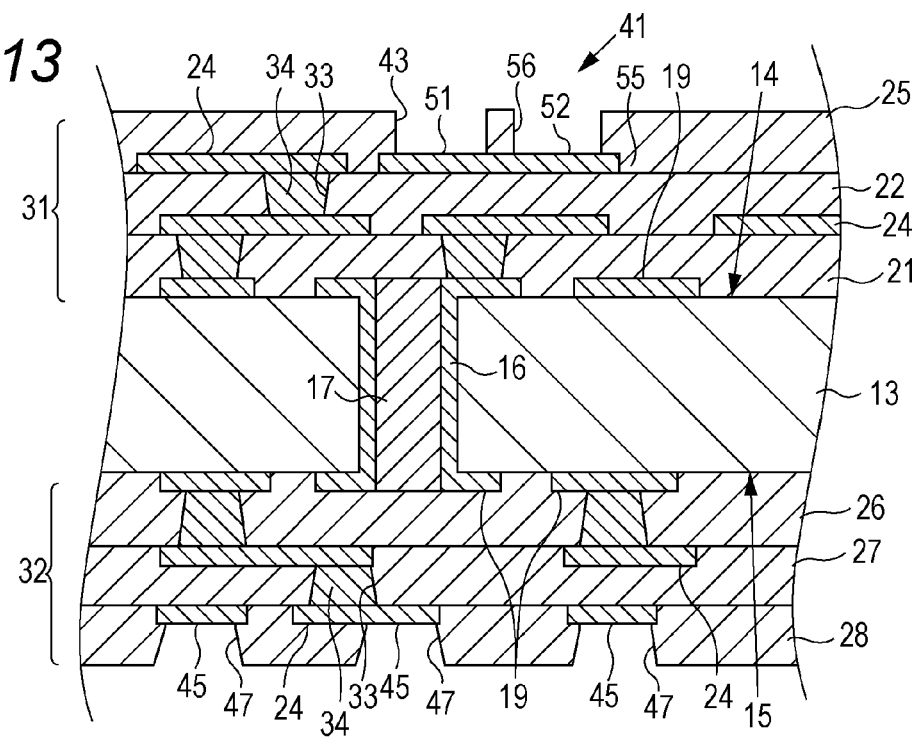
FIG. 13 is an explanatory view illustrating the method for manufacturing the organic wiring board according to the one embodiment.

Subsequently, a solder resist layer-forming step is performed to form the solder resist layer 25 of the first buildup layer 31. For details, firstly, on the resin insulating layer 22, an insulator film 71 with photosensitivity (for example, a film made of resin insulating material such as photosensitive epoxy resin) to be the solder resist layer 25 is pasted to cover the side surface and the top surface of the connecting terminal portion 41 (see FIG. 11). In order to ensure flatness of the surface, the insulator film 71 is pressed in its thickness direction. Subsequently, as illustrated in FIG. 12, a mask 72 is arranged on the insulator film 71, a region to be the peripheral area of the opening portion 43 and a region to be the projecting wall portion 56 are exposed through the mask 72, and then development is performed. This development forms the opening portion 43 to expose the surface of the connecting terminal portion 41 while leaving a portion of the side-surface covering portion 55 between the respective connecting terminal portions 41, and forms the projecting wall portion 56 integrally connected to the side-surface covering portion 55. Furthermore, the remaining part of the side-surface covering portion 55 between the respective connecting terminal portions 41 is exposed. Thus, after exposure and development are repeated, hardening treatment by heat or ultraviolet rays is performed so as to form the solder resist layer 25 that includes the side-surface covering portion 55 and the projecting wall portion 56 within the opening portion 43 (see FIG. 13). The part of the side-surface covering portion 55 may be subjected to hardening treatment alone without undergoing exposure.

The solder resist layer 28 of the second buildup layer 32 are also exposed and developed in a state where a predetermined mask is arranged. The opening portion 47 is patterned into the solder resist layer 28, and then hardening treatment is performed (see FIG. 13). Subsequently, the surface (the top surface) of the connecting terminal portion 41 exposed from the opening portion 43 is subjected to electroless tin plating to form the plating layer 53. This electroless tin plating also forms the plating layer 48 on the surface (the inferior surface) of the external connecting terminal 45 exposed from the opening portion 47. The organic wiring board 10 illustrated in FIG. 1 and FIG. 2 is manufactured through the above-described manufacturing processes.

Subsequently, using a solder ball mounting device (not shown), a reflow step is performed to heat the solder balls in the state where solder balls are arranged on the respective external connecting terminals 45. Accordingly, the solder bumps 49 can also be formed on the respective external connecting terminal 45.

Accordingly, this embodiment provides the following effects.

(1) In the organic wiring board 10 according to this embodiment, within the opening portion 43 in the solder resist layer 25, the projecting wall portion 56 is integrally formed with the side-surface covering portion 55, which covers the side surface of the connecting terminal portion 41. This formation ensures sufficient strength of the projecting wall portion 56, and avoids the problem that the projecting wall portion 56 is delaminated. The projecting wall portion 56 is disposed to project so as to intersect with the connection region 51 in the connecting terminal portion 41. Accordingly, the projecting wall portion 56 functions as a solder dam when the semiconductor chip is mounted. As a result, this prevents the problem that the solder in the connection region 51 flows out to the wiring region 52, and reliably holds the solder in the connection region 51. Accordingly, this enhances connection reliability with the semiconductor chip in the organic wiring board 10.

(2) In the organic wiring board 10 according to this embodiment, the projecting wall portion 56 is integrally formed with the inner wall surface 58, which forms the opening portion 43 in the solder resist layer 25. This increases the strength of the projecting wall portion 56, thus reliably avoiding the problem that the projecting wall portion 56 is delaminated.

(3) In this embodiment, in the solder resist layer-forming step, the insulator film 71 is arranged on the connecting terminal portion 41. In order to ensure flatness of the surface, the insulator film 71 is pressed in its thickness direction, and then is exposed and developed. This ensures sufficient flatness of the surface of the side-surface covering portion 55 and the surface of the projecting wall portion 56, thus improving the connection reliability of the organic wiring board 10.

(4) In the organic wiring board 10 according to this embodiment, the plurality of connecting terminal portions 41 are arrayed such that the respective extending directions of the wiring regions 52 are parallel to one another. Additionally, in the connecting terminal portions 41 adjacent along the arranging direction, the connection regions 51 are disposed in the mutually shifted positions in the direction perpendicular to the arranging direction (the extending direction of the wiring region 52) such that the positions of the connection regions 51 do not overlap one another along the arranging direction of the respective connecting terminal portions 41. This allows narrowing the terminal pitch between the plurality of connecting terminal portions 41, thus increasing the density of the organic wiring board 10.

(5) In the organic wiring board 10 according to this embodiment, the side surface of the connecting terminal portion 41 is covered with the side-surface covering portion 55 of the solder resist layer 25. Accordingly, the side-surface covering portion 55 reliably holds the connecting terminal portion 41 with the narrow width. This increases the density of the organic wiring board 10 and enhances connection reliability of the board.

The embodiment of the present invention may be modified as follows.

Figure 14:
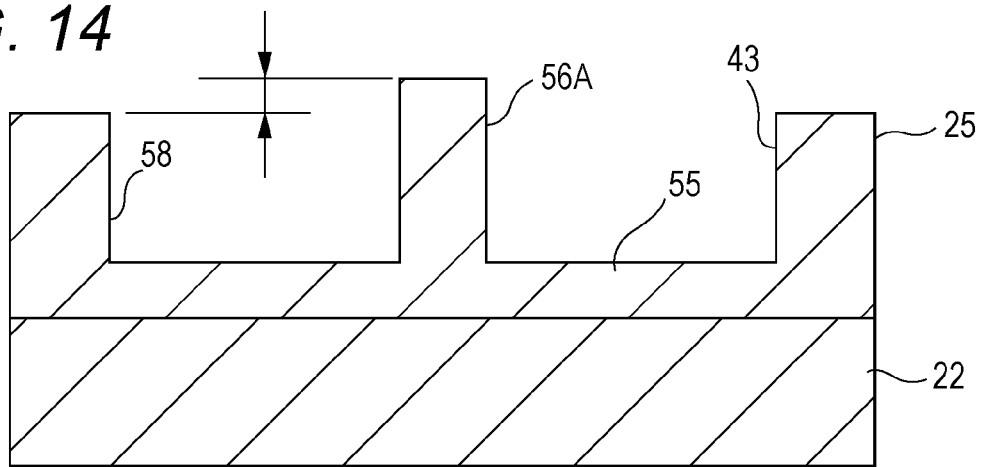
FIG. 14 is an enlarged sectional view illustrating the projecting wall portion according to another embodiment.
Figure 15:
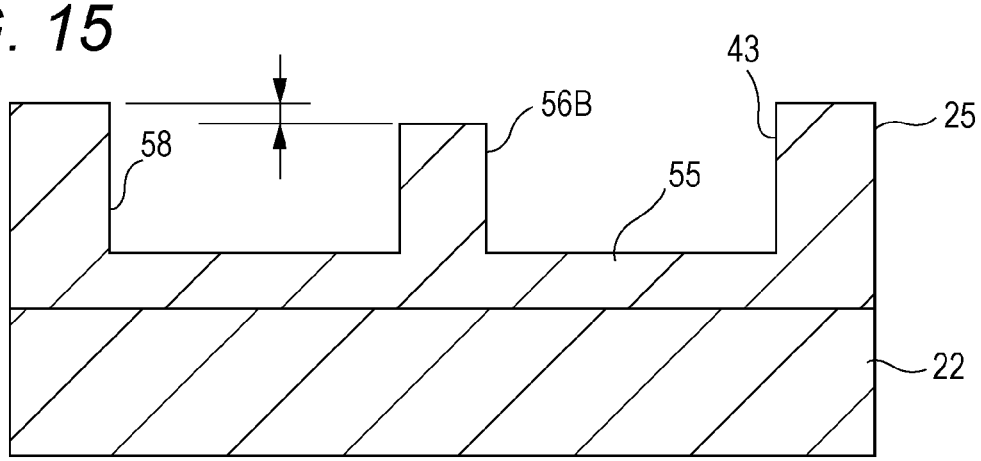
FIG. 15 is an enlarged sectional view illustrating the projecting wall portion according to another embodiment.

While in the organic wiring board 10 of the above-described embodiment the projecting wall portion 56 is formed to have the same height as the height of the peripheral portion of the opening portion 43 in the solder resist layer 25, this should not be construed in a limiting sense. For example, the height may be changed as necessary corresponding to the type or the usage of the solder during connection of the chip. Specifically, as illustrated in FIG. 14, a projecting wall portion 56A higher than the height of the peripheral portion of the opening portion 43 may be formed in the solder resist layer 25. As illustrated in FIG. 15, a projecting wall portion 56B lower than the height of the peripheral portion of the opening portion 43 may be formed. These projecting wall portions 56A and 56B are integrally formed with the side-surface covering portion 55 by repeating partial exposure and development in the insulator film 71 a plurality of times in stages, similarly to the above-described embodiment.

Specifically, in case of forming the projecting wall portion 56A of FIG. 14 in the solder resist layer 25, a region to be the peripheral area of the opening portion 43 in the insulator film 71 is exposed and then development is performed such that a portion corresponding to the opening portion 43 becomes slightly thin. Subsequently, a region to be the projecting wall portion 56A is exposed and then development is performed, so as to form the opening portion 43 in the solder resist layer 25 and to form the side-surface covering portion 55 and the projecting wall portion 56A. In case of forming the projecting wall portion 56B of FIG. 15 in the solder resist layer 25, a region to be the projecting wall portion 56B in the insulator film 71 is exposed and then development is performed such that the region other than the projecting wall portion 56B becomes slightly thin. Subsequently, a region to be the peripheral area of the opening portion 43 is exposed and then development is performed so as to form the opening portion 43 in the solder resist layer 25 and to form the side-surface covering portion 55 and the projecting wall portion 56B.

Figure 16:
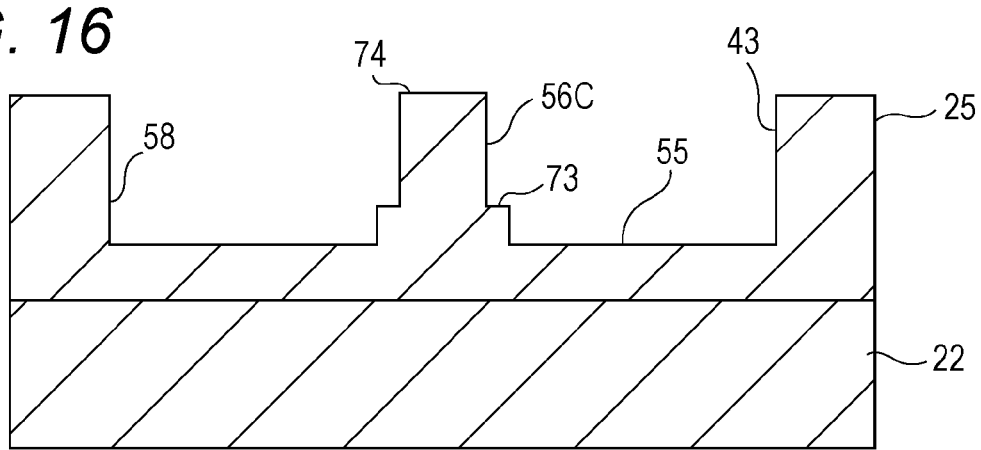
FIG. 16 is an enlarged sectional view illustrating the projecting wall portion according to another embodiment.

While in the organic wiring board 10 of the above-described embodiment the projecting wall portions 56, 56A, and 56B are formed with uniform width along the thickness direction, this should not be construed in a limiting sense. Like a projecting wall portion 56C illustrated in FIG. 16, steps may be disposed at a base end 73 side such that the width at the base end 73 side becomes larger than that at a distal end 74 side. This projecting wall portion 56C are also integrally formed with the side-surface covering portion 55 by repeating partial exposure and development in the insulator film 71 a plurality of times in stages. Like this projecting wall portion 56C, expanding the width at the base end 73 side increases the connection area with the side-surface covering portion 55 and further enhances the strength of the projecting wall portion 56C.

While in the organic wiring board 10 of the above-described embodiment one projecting wall portion 56 is formed in the opening portion 43, a plurality of projecting wall portions 56 may be formed. For example, three projecting wall portions 56 may be formed to sandwich the connection regions 51 between the respective projecting wall portions 56. In this case, in each connecting terminal portion 41, the connection region 51 and the wiring region 52 are partitioned with the projecting wall portion 56. This more reliably prevents the solder from flowing out from the connection region 51.

While in the organic wiring board 10 of the above-described embodiment the projecting wall portion 56 is formed in a straight line so as to perpendicularly intersect with the plurality of wiring regions 52 within the opening portion 43, this should not be construed in a limiting sense. For example, in addition to the projecting wall portion 56 perpendicular to each connecting terminal portion 41, mutually parallel projecting wall portions between the respective connecting terminal portions 41 may be formed. Alternatively, for example, a frame-shaped projecting wall portion that surrounds each connection region 51 may be formed. Furthermore, the projecting wall portion 56 may intersect at an angle inclined with respect to the plurality of wiring regions 52 of the connecting terminal portion 41. Specifically, the projecting wall portion may be disposed, for example, to be bent in a zigzag shape corresponding to the respective connection regions 51 in a staggered arrangement, and to intersect at an angle inclined with respect to the respective wiring regions 52. Forming the resist pattern of these projecting wall portions also prevents the solder in the connection region 51 from flowing out. Additionally, integrally forming the projecting wall portion with the side-surface covering portion 55 ensures the strength of the projecting wall portion, thus avoiding the problem that the pattern of the projecting wall portion is delaminated.

While in the organic wiring board 10 of the above-described embodiment the respective wiring regions 52 are disposed to extend from both sides of the connection region 51 in each connecting terminal portion 41, the wiring region 52 may be disposed to extend from one side of the connection region 51. Furthermore, the present invention may be embodied in a wiring board that includes the connecting terminal portion 41 where the respective wiring regions 52 are disposed to extend from both sides of the connection region 51 and the connecting terminal portion where the wiring region 52 is disposed to extend from one side of the connection region 51.

While in the organic wiring board 10 of the above-described embodiment the wiring board includes the core substrate 13, this should not be construed in a limiting sense. The present invention may be applied to a coreless wiring board that does not include the core.

While the form of the organic wiring board 10 in the above-described embodiment is ball grid array (BGA), the form is not limited only to BGA. For example, the present invention may be applied to a wiring board in the form of pin grid array (PGA), land grid array (LGA), or similar package.

Next, some of the technical ideas that the embodiment described above implements, are enumerated below.

(1) The wiring board described in Means 1 has a feature that the wiring board is an organic wiring board using a resin insulating layer as an insulating layer.

(2) The wiring board has a feature that, in Means 1, the wiring region is disposed to extend from both sides or from one side of the connection region.

(3) The wiring board has a feature that, in Means 1, a terminal pitch between the plurality of connecting terminal portions is 80 μm or less.

(4) The wiring board has a feature that, in Means 1, a plurality of the connecting terminal portions is arrayed such that respective extending directions of the wiring regions are parallel to one another, and in connecting terminal portions adjacent along an arranging direction, the respective connection regions are disposed in mutually shifted positions in a direction perpendicular to the arranging direction such that respective positions of the connection regions do not overlap one another along the arranging direction.

(5) The method for manufacturing the wiring board has a feature that, in Means 2, the resin insulating material is an insulator film, in the solder resist layer-forming step, the insulator film is arranged on the connecting terminal portion, the insulator film is pressed in a thickness direction of the film in order to ensure flatness of a surface of the insulator film, and then exposure and development are performed.

DESCRIPTION OF REFERENCE SIGNS 10 organic wiring board as wiring board
21, 22 resin insulating layer as insulating layer
24 conductor layer
25 solder resist layer 31 first buildup layer as laminated body
41 connecting terminal portion
43 opening portion
51 connection region
52 wiring region
55 side-surface covering portion
56, 56A to 56C projecting wall portion
71 insulator film as resin insulating material
R1 mounting area for semiconductor chip

What is claimed is:

1. A wiring board, comprising
a laminated body where respective one or more layers of insulating layers and conductor layers are laminated, the conductor layer in an outermost layer of the laminated body including a plurality of connecting terminal portions disposed in a mounting area for a semiconductor chip so as to flip-chip mount the semiconductor chip, a solder resist layer being disposed as the insulating layer in an outermost layer of the laminated body, the plurality of connecting terminal portions including a surface exposed through an opening portion formed in the solder resist layer, wherein
for each of the plurality of the connection terminal portions exposed through the opening portion, the connecting terminal portion includes a connection region and a wiring region, the connection region being to connect to a connecting terminal of the semiconductor chip via solder, the wiring region exposed through the opening portion and being disposed to extend from the connection region along a planar direction, and
the solder resist layer includes a side-surface covering portion and a projecting wall portion within the opening portion, the side-surface covering portion covering a side surface of each connecting terminal portion, the projecting wall portion being integrally formed with the side-surface covering portion, the projecting wall portion being disposed to project so as to intersect with the connection region of each connecting terminal portion and divide each connecting terminal portion into the connection region and the wiring region with the connection regions arrayed alternately on either side of the projecting wall portion to connect the semiconductor chip.

2. The wiring board according to claim 1, wherein
the projecting wall portion is integrally formed with an inner wall surface of the solder resist layer, the inner wall surface forming the opening portion.

3. The wiring board according to claim 1, wherein
the projecting wall portion has a width of 5 μm or more and 50 μm or less.

4. A method for manufacturing the wiring board of claim 1, the method comprising:
a conductor-layer forming step of forming the conductor layer in the outermost layer of the laminated body, the conductor-layer forming step forming the plurality of connecting terminal portions that each includes the connection region and the wiring region, the connection region being to connect to the connecting terminal of the semiconductor chip via solder, the wiring region being disposed to extend from the connection region along a planar direction; and
a solder resist layer-forming step of: arranging a resin insulating material with photosensitivity to be the solder resist layer so as to cover the side surface and the top surface of each connecting terminal portion; repeating partial exposure and development on the resin insulating material a plurality of times in stages so as to form the opening portion with the wiring regions exposed through the opening portion; and forming the solder resist layer that includes the side-surface covering portion and the projecting wall portion, the side-surface covering portion covering the side surfaces of the connecting terminal portions within the opening portion, the projecting wall portion being integrally formed with the side-surface covering portion, the projecting wall portion being disposed to project so as to intersect with the connection region of each connecting terminal portion and divide each connecting terminal portion into the connection region and the wiring region with the connection regions arrayed alternately on either side of the projecting wall portion to connect the semiconductor chip.

* * * * *